United States Patent
Kuehn

(10) Patent No.: US 6,957,052 B2
(45) Date of Patent: Oct. 18, 2005

(54) TRANSMISSION SYSTEM, RECEIVER, CIRCUIT, AND METHOD FOR REMOVING INTERFERENCE COMPONENTS IN A SIGNAL

(75) Inventor: Arie Kuehn, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 642 days.

(21) Appl. No.: 09/756,933

(22) Filed: Jan. 9, 2001

(65) Prior Publication Data

US 2001/0018331 A1 Aug. 30, 2001

(30) Foreign Application Priority Data

Jan. 10, 2000 (EP) ............................................ 00200035

(51) Int. Cl.[7] ................................................ H04B 1/04
(52) U.S. Cl. ................... 455/114.3; 455/67.13; 455/306
(58) Field of Search ........................ 455/425, 501–506, 455/67.11–67.16, 114.1–115.4, 226.1–226.4, 296–312, 424, 10, 64, 66.1, 63.1, 575.5

(56) References Cited

U.S. PATENT DOCUMENTS

| | | | | |
|---|---|---|---|---|
| 4,223,282 A | * | 9/1980 | De Boer | 332/183 |
| 4,272,846 A | * | 6/1981 | Muratani et al. | 455/296 |
| 4,286,334 A | * | 8/1981 | Gammel et al. | 375/267 |
| 5,420,536 A | * | 5/1995 | Faulkner et al. | 330/149 |
| 5,903,819 A | * | 5/1999 | Romesburg | 455/63.1 |
| 6,539,204 B1 | * | 3/2003 | Marsh et al. | 455/63.1 |

FOREIGN PATENT DOCUMENTS

| | | | |
|---|---|---|---|
| EP | 0526662 A1 | 2/1993 | |
| EP | 0696852 A2 | 2/1996 | |
| WO | WO9812821 | 3/1998 | H04B/1/10 |

* cited by examiner

*Primary Examiner*—Charles Craver
(74) *Attorney, Agent, or Firm*—Steven R. Petersen

(57) ABSTRACT

The transmission system according to the invention comprises a transmitter (10) and a receiver (12). The transmitter (10) can transmit a signal (11) to the receiver (12). The receiver (12) comprises an interference absorption circuit (20) for detecting interference components included in the signal (11) and for substantially removing, during a time interval ($\Delta t$), the interference components from the signal (11). The interference absorption circuit (20) is arranged for adapting the time interval ($\Delta t$) in dependence on the duration of the individual interference components. Preferably, the time interval ($\Delta t$) is substantially equal to the duration of the individual interference components. In this way, despite the fact that the interference components have a variable duration, the interference components can be accurately removed from the desired signal (11).

18 Claims, 6 Drawing Sheets

Figure 1:
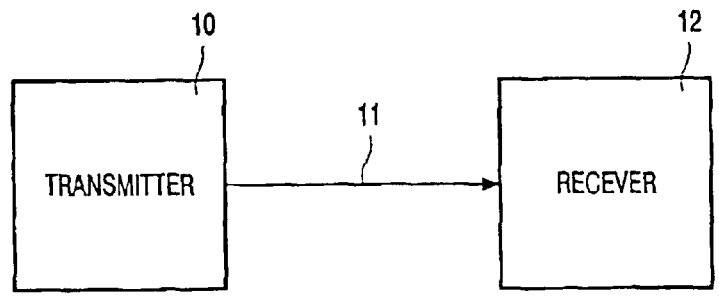

TRANSMISSION SYSTEM, RECEIVER, CIRCUIT, AND METHOD FOR REMOVING INTERFERENCE COMPONENTS IN A SIGNAL

The invention relates to a transmission system for transmitting a signal from a transmitter to a receiver, the receiver comprising an interference absorption circuit for detecting interference components included in the signal and for substantially removing, during a time interval, the interference components from the signal.

The invention further relates to a receiver for receiving a signal from a transmitter, an interference absorption circuit for detecting interference components included in a signal and for substantially removing the interference components from the signal and to a method of detecting interference components included in a signal and of substantially removing the interference components from the signal.

A transmission system according to the preamble is known from the International Patent Application WO 98/12821. Many transmission systems, in particular wireless transmission systems such as radio and television transmission systems, are vulnerable to parasitic signal components which enter the transmission system and which interfere with the desired signal. These parasitic signal components or interference components, e.g. impulsive noise or ingress noise components, are commonly detected and removed in the receiver by means of an interference absorption circuit. Such an interference absorption circuit removes undesired interference components from the desired signal either

- by keeping the desired signal at a constant level (sample and hold), or
- by setting the desired signal to zero (mute) during a certain time interval from the moment that an interference component has been detected.

The known transmission systems suffer from the drawback that the removal of the interference components from the desired signal is relatively inaccurate.

An object of the invention is to provide a transmission system for transmitting a signal from a transmitter to a receiver, wherein the removal of the undesired interference components from the desired signal is relatively accurate. This object is achieved in the transmission system according to the invention, which is characterized in that the interference absorption circuit is arranged for adapting the time interval in dependence on the duration of the individual interference components. In the known transmission systems the time interval is kept constant, although the duration of the interference components is variable. This leads to a removal of part of the desired signal in case of relatively short interference components or to a removal of only part of the interference components in case of relatively long interference components. By adapting the time interval during which the interference components are removed from the signal in dependence on the duration of the individual interference components a more accurate removal of the interference components is achieved.

An embodiment of the transmission system according to the invention is characterized in that the time interval is substantially equal to the duration of the individual interference components. In this way a near perfect removal of the interference components is achieved.

An embodiment of the transmission system according to the invention is characterized in that the interference absorption circuit comprises a circuit input for receiving the signal, interference detection means coupled to the circuit input for detecting the interference components included in the signal and interference removal means coupled to the circuit input for substantially removing the interference components from the signal, an output of the interference detection means being coupled to an input of the interference removal means. The main functions of the interference absorption circuit, i.e. detection and removal of interference components, are efficiently implemented by the interference detection means and the interference removal means. The interference detection means and the interference removal means are coupled to each other so that the interference removal means can remove those interference components that have been detected by the interference detection means.

An embodiment of the transmission system according to the invention is characterized in that the interference detection means is arranged for generating and supplying to the output an interference presence signal indicative of the presence of the interference components in the signal, the interference removal means being arranged for substantially removing the interference components from the signal in dependence on the interference presence signal received at the input. By means of the interference presence signal which indicates the presence of the interference components in the signal an effective coupling between the interference detection means and the interference removal means is achieved.

An embodiment of the transmission system according to the invention is characterized in that the interference detection means is arranged for generating the interference presence signal in dependence on the duration of the individual interference components. As, by this measure, the interference presence signal comprises information related to the duration of the individual interference components the interference removal means can accurately remove the interference components from the signal.

An embodiment of the transmission system according to the invention is characterized in that the interference detection means comprise timing means for generating the interference presence signal. By this measure the interference presence signal can be generated in an efficient and cost effective way.

An embodiment of the transmission system according to the invention is characterized in that the interference detection means further comprise an interference detector coupled to the timing means for detecting the interference components in the signal, the timing means comprising a multiple triggerable pulse timer, the interference detector being arranged for generating and supplying to the timing means a number of trigger pulses, the number of trigger pulses being dependent on the duration of the interference components. By these measures a simple, efficient and cost-effective implementation of the interference detection means is obtained. Simple implementations of such an interference detector have been found based upon amplitude detection or slope detection. By triggering the multiple triggerable pulse timer a number of times in dependence on the duration of the individual interference components, the interference presence signal comprises information related to the duration of the individual interference components. Furthermore, multiple triggerable pulse timers are simple and inexpensive and are even available as standard electronic components.

An embodiment of the transmission system according to the invention is characterized in that the interference absorption circuit comprises a desensitizer for temporarily disabling the interference detection means and/or the interference removal means when a repetition rate of the interference components is too high. In this way multiple triggering is prevented under noisy conditions. Under such conditions a relatively large part of the signal is removed by the interference removal means, leaving relatively little signal content, which might cause an AGC in the receiver to amplify the signal more, which in turn leads to more interference components being detected and more parts of the signal being removed, etc.

An embodiment of the transmission system according to the invention is characterized in that the interference absorption circuit further comprises delay means for delaying the signal, the interference removal means being coupled to the circuit input via the delay means, the delay introduced by the delay means being substantially equal to the delay introduced by the interference detection means. By this measure, any delay introduced by the interference detection means is compensated so that the interference presence signal is in phase with the signal. Otherwise, i.e. if the interference presence signal were out of phase with the signal, the removal of the interference components could not be accurately performed.

Figures 2A, 2B:
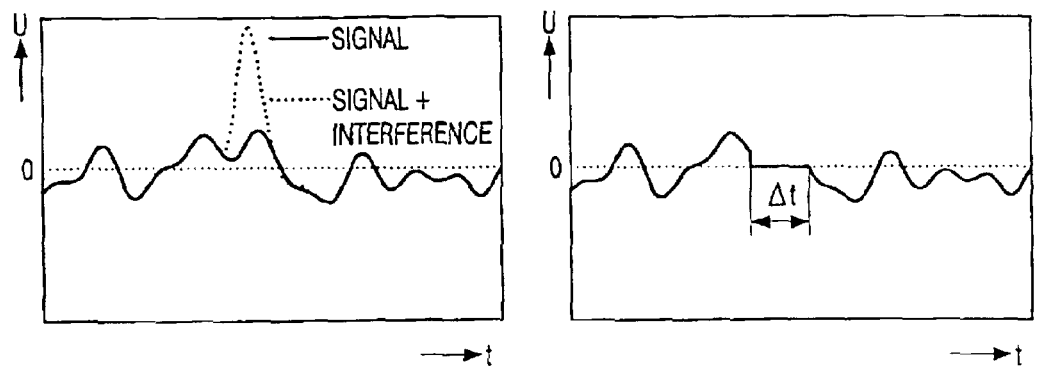
Figure 3:
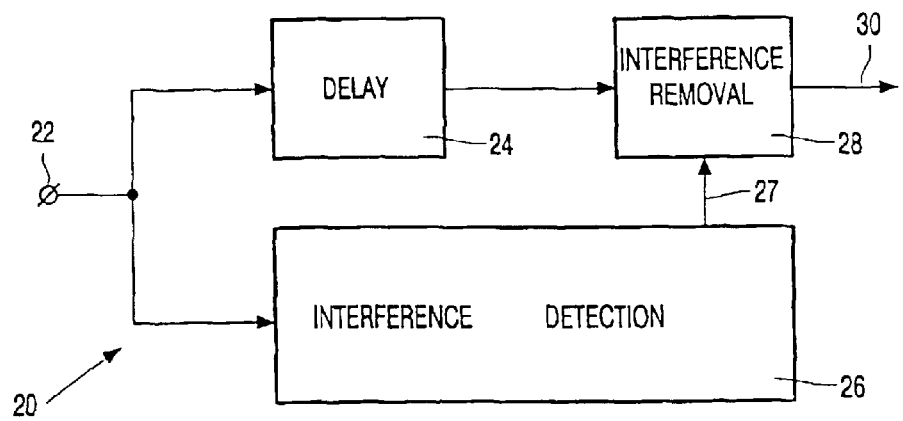
Figure 4:
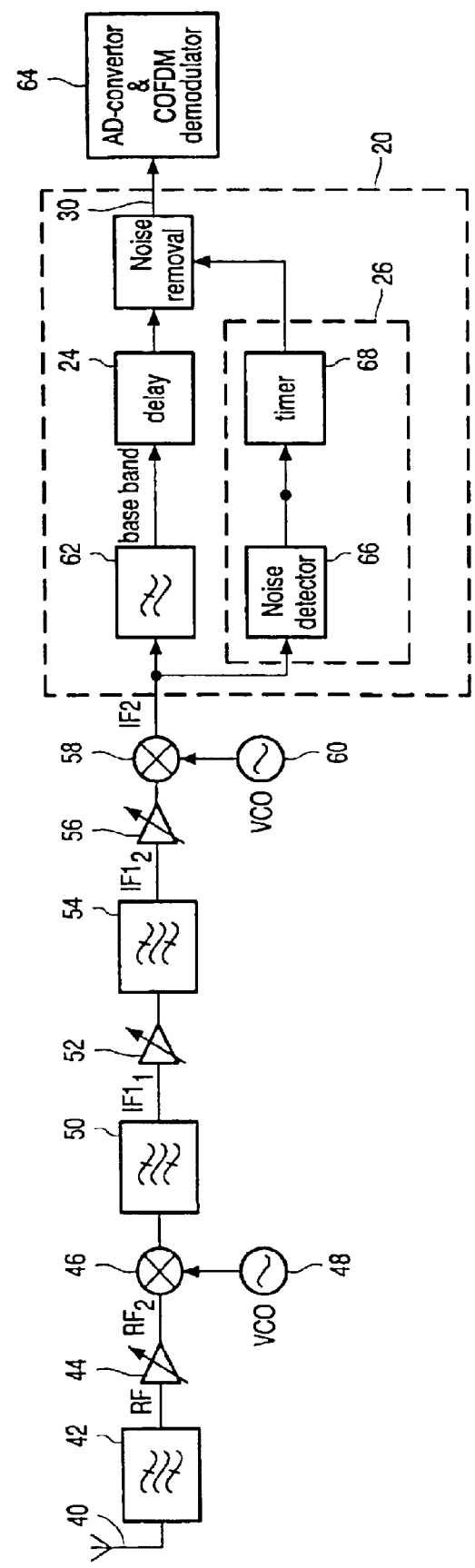
Figure 5:
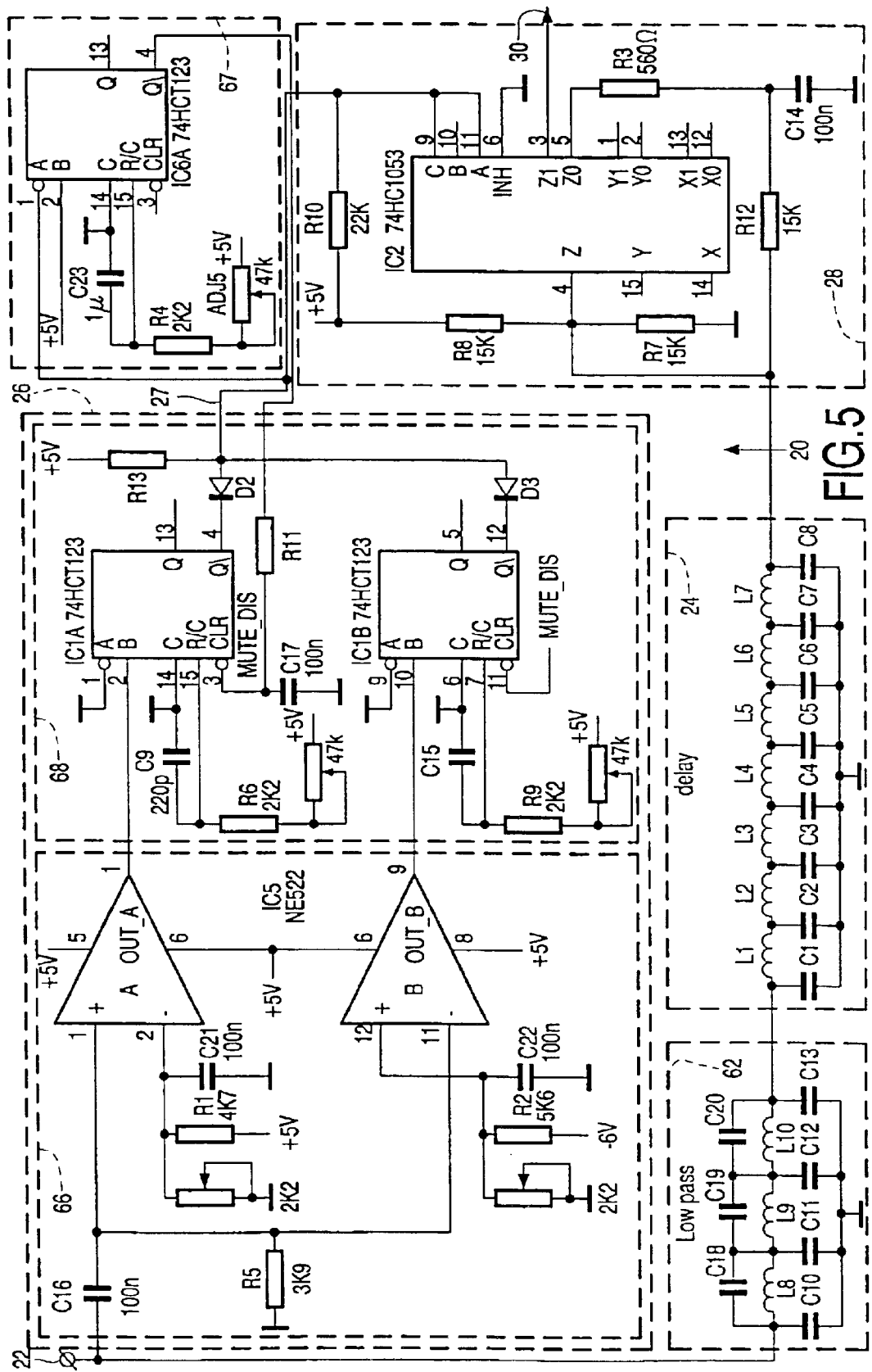
Figure 6A:
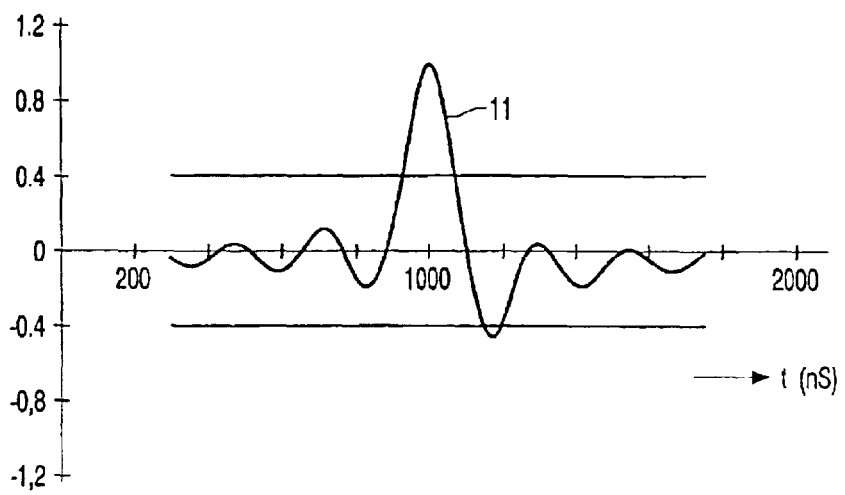
Figure 6B:
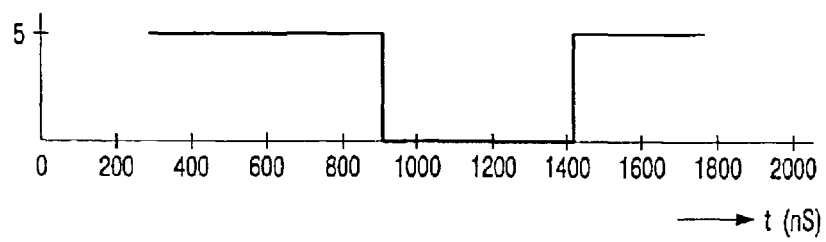
Figure 6C:
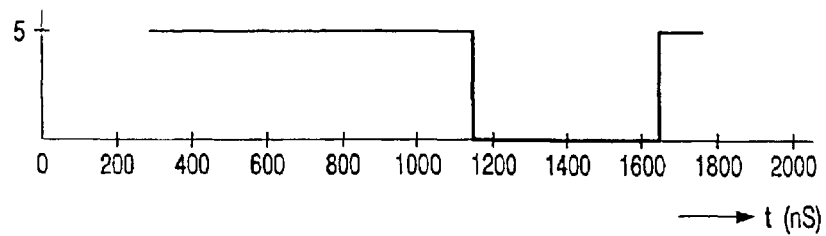
Figure 6D:
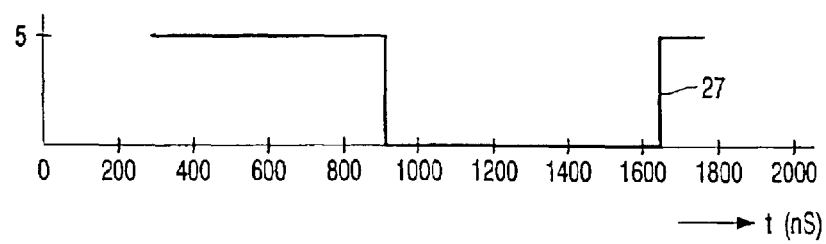
Figure 6E:
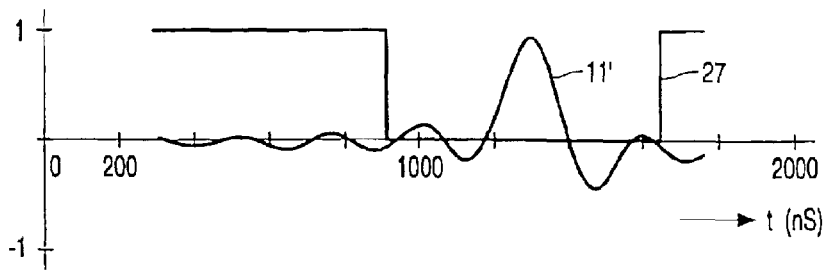
Figure 7:
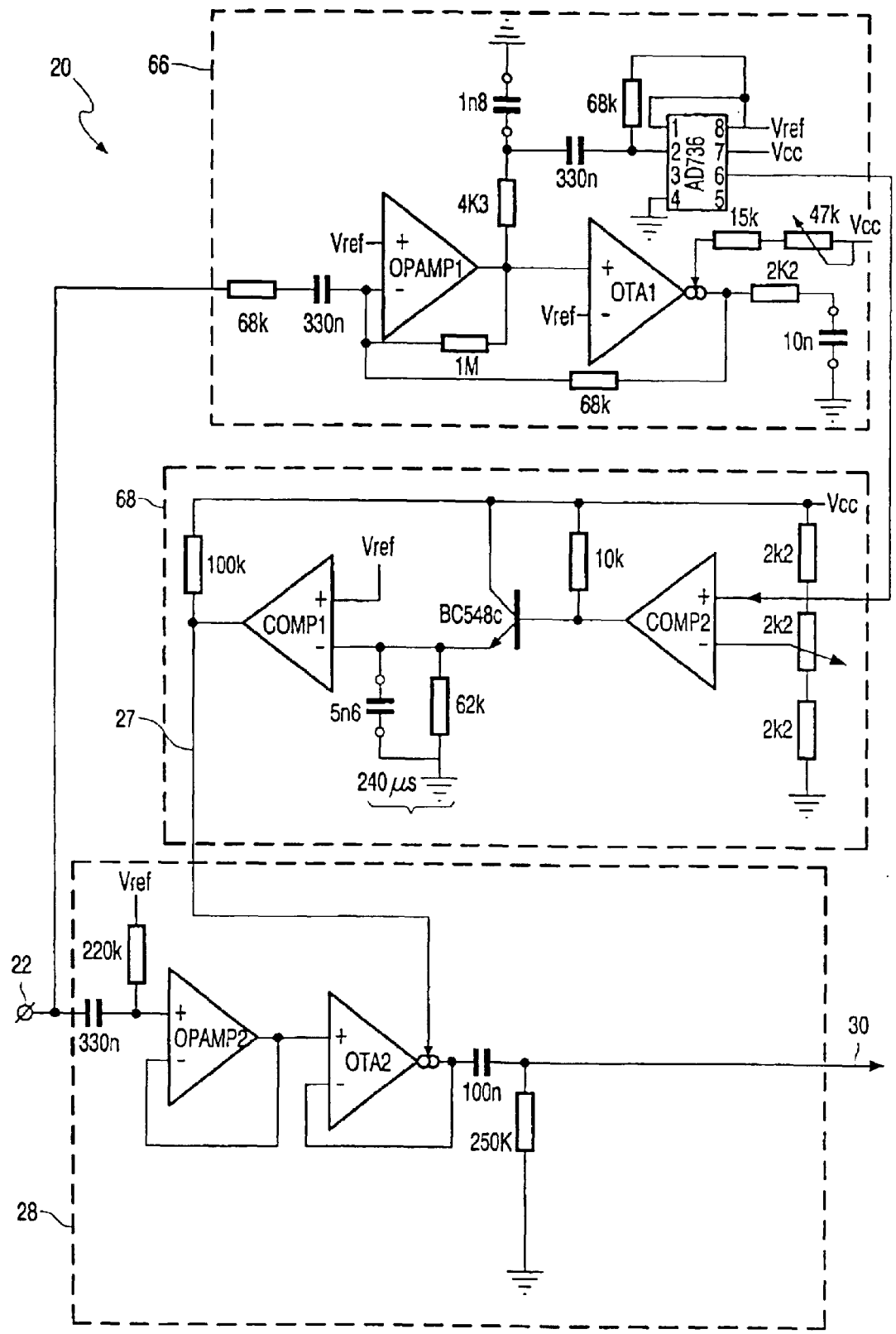
Figure 8A:
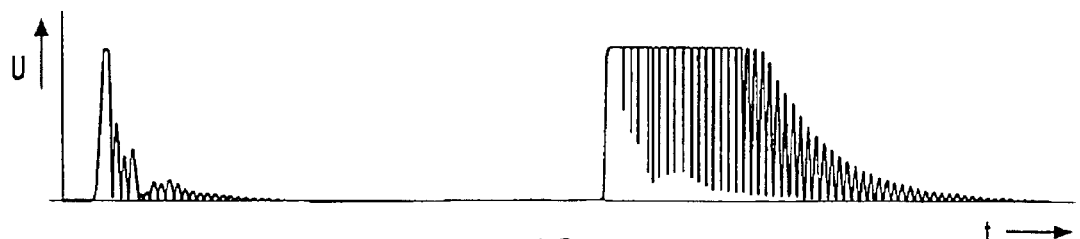
Figure 8B:
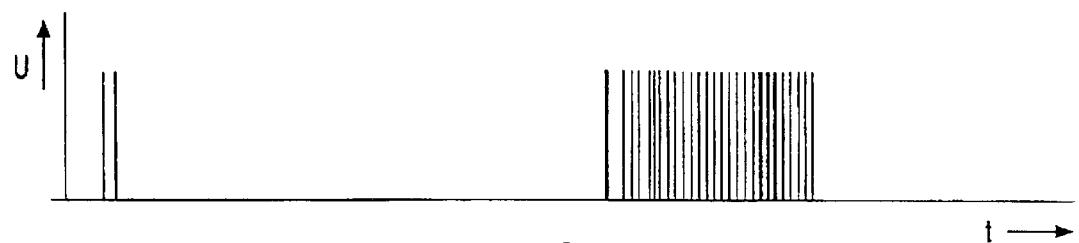
Figure 8C:
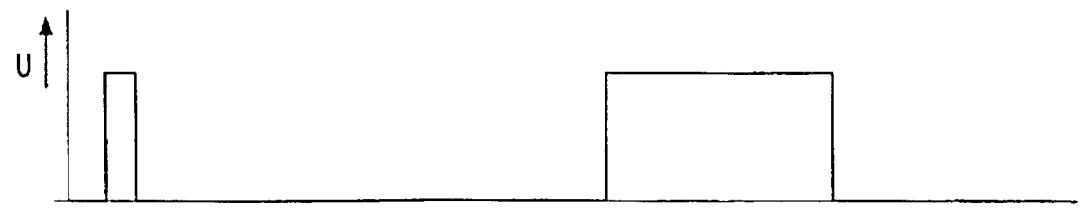

The above object and features of the present invention will be more apparent from the following description of the preferred embodiments with reference to the drawings, wherein:

FIG. 1 shows a block diagram of an embodiment of a transmission system according to the invention, FIGS. 2A and 2B show some waveforms which illustrate the operation of an interference absorption circuit according to the invention, FIG. 3 shows a block diagram of an embodiment of an interference absorption circuit according to the invention, FIG. 4 shows a block diagram of a receiver according to the invention, FIG. 5 shows an electrical diagram of an embodiment of an interference absorption circuit according to the invention, FIGS. 6A to 6E show some waveforms which illustrate the operation of the interference absorption circuit as shown in FIG. 5, FIG. 7 shows an electrical diagram of another embodiment of an interference absorption circuit according to the invention, FIG. 8 shows some waveforms which illustrate the operation of the interference absorption circuit as shown in FIG. 7.

In the Figures, identical parts are provided with the same reference numbers.

FIG. 1 shows a block diagram of an embodiment of a transmission system according to the invention. In such a transmission system a signal 11, e.g. a multicarrier signal, is transmitted by a transmitter 10 to a receiver 12. The transmission system may comprise further transmitters 10 and receivers 12. The transmitters 10 and the receivers 12 can be of many different types depending on the particular application area. For example, in a Wireless Asynchronous Transfer Mode (WATM) system which supports high speed, short distance radio links between computer systems, a two-way radio communication link could be established between a personal computer and a printer. For this purpose, the personal computer and the printer are both equipped with a transmitter 10 and a receiver 12. Alternatively, in a radio broadcast system, e.g. an AM-, FM- or Digital Audio Broadcast (DAB)system, the transmitter 10 could be part of a radio broadcast station, while the receiver 12 could be included in a car radio. In a DVB-T digital terrestrial television system the transmitter 10 could be part of television broadcast station, while the receiver 12 could be a television receiver or a set-top box.

The receiver 12 comprises an interference absorption circuit (not shown) for detecting interference components included in the signal 11 and for substantially removing, during a time interval the interference components from the signal 11.

FIGS. 2A and 2B show some waveforms which illustrate the operation of an interference absorption circuit according to the invention. In FIG. 2A a desired signal with superimposed thereon an interference component (an impulsive noise component) is shown. This signal is input to an interference absorption circuit which detects the interference component and removes it from the desired signal, e.g. by muting the signal during a time interval $\Delta t$. The resulting signal is shown in FIG. 2B. The interference absorption circuit is arranged for adapting the time interval $\Delta t$ in dependence on the duration of the individual interference components. Preferably, the time interval $\Delta t$ is substantially equal to the duration of the individual interference components so that a near perfect removal of the interference components is achieved.

FIG. 3 shows a block diagram of an embodiment of an interference absorption circuit 20 according to the invention. The interference absorption circuit 20 comprises a circuit input 22 for receiving the signal 11, interference detection means 26 coupled to the circuit input 22 for detecting the interference components included in the signal 11, interference removal means 28 coupled via delay means 24 to the circuit input 22 for substantially removing the interference components from the signal 11 and a circuit output 30 for supplying the 'cleaned-up' signal. An output of the interference detection means 26 is coupled to an input of the interference removal means 28. The interference detection means 26 generates an interference presence signal 27 which is indicative of the presence of the interference components in the signal 11. This interference presence signal 27 is supplied by the interference detection means 26 to the interference removal means 28. The interference removal means 28 uses the interference presence signal 27 to substantially remove the interference components from the signal 11.

The delay means 24 can be used in the interference absorption circuit 20 for delaying the signal 11 in order to compensate for any delay introduced by the interference detection means 26. If the interference detection means 26 does not introduce a significant delay, the delay means 24 may be omitted.

FIG. 4 shows a block diagram of a receiver according to the invention. The receiver shown is a DVB-T receiver. This receiver receives a RF-signal via an antenna 40 which is coupled to a band-pass filter 42. This band-pass filter 42 provides a desired RF-selectivity. The output of the band-pass filter 42 is coupled via an AGC 44 to a mixer 46. This mixer 46 is also coupled to an oscillator 48 and uses the oscillation signal to perform a frequency down conversion of the output signal of the AGC 44. Next, the output signal of the mixer 46 is supplied via a further band-pass filter 50 to a further AGC 52. This AGC 52 is coupled to yet another band-pass filter 54. Preferably, the band-pass filters 50 and 54 are SAW filters. The output of the band-pass filter 54 is coupled via an AGC 56 to a mixer 58. This mixer 58 is also coupled to an oscillator 60 and uses the oscillation signal to perform a frequency down conversion of the output signal of the AGC 56.

The output signal 11 of the mixer 58 is input to the interference absorption circuit 20. This interference absorption circuit 20 comprises, in addition to the components already shown and discussed in relation to FIG. 3, a low-pass anti-aliasing filter 62 which is connected between the circuit input 22 and the delay means 24. The interference detection means 26 comprise an interference detector 66 for detecting the interference components in the signal 11 and coupled thereto timing means 68 for generating the interference presence signal 27. The interference detector 66 generates a number of trigger pulses, the number of trigger pulses being dependent on the duration of the interference components. These trigger pulses are supplied by the interference detector 66 to the timing means 68. The timing means 68 comprise a multiple triggerable pulse timer for generating the interference presence signal 27 in dependence on the number of trigger pulses received from the interference detector 66.

The output 30 of the interference absorption circuit 20 is coupled to a receiver back-end part which comprises an AD-converter and a COFDM-demodulator. The AD-converter converts the 'cleaned-up' analog output signal 30 of the interference absorption circuit 20 into a digital signal which is demodulated by means of the COFDM-demodulator.

FIG. 5 shows an electrical diagram of an embodiment of an interference absorption circuit 20 according to the invention for use in a receiver as shown in FIG. 4. The interference detector 66 is an amplitude detector which comprises two voltage comparators A and B (e.g. as provided in the integrated circuit NE522). The voltage comparator A detects interference components included in the signal 11 which exceed a positive voltage threshold. This positive voltage threshold is set by an adjustable voltage divider connected to input 2 of the voltage comparator A. The voltage comparator B detects interference components included in the signal 11 which exceed a negative voltage threshold. This negative voltage threshold is set by another adjustable voltage divider which is connected to input 12 of the voltage comparator B. Alternatively, the amplitude detector may comprise a rectifier and a single voltage comparator which detects interference components exceeding a positive voltage threshold.

The signal 11, which enters the interference absorption circuit 20 via the circuit input 22, is fed into the voltage comparators A and B via a capacitor C16. This capacitor C16 blocks DC components which may be included in the signal 11.

The timing means 68 comprise two multiple triggerable pulse timers IC1A and IC1B (such as included in the Philips' 74HCT123 integrated circuit). An input of timer IC1A is coupled to an output of the voltage comparator A and in input of timer IC1B is coupled to an output of the voltage comparator B. When an interference component exceeding the positive voltage threshold is detected by the voltage comparator A, timer IC1A is triggered for a period of e.g. 500 ns. When an interference component exceeding the negative voltage threshold is detected by the voltage comparator B, timer IC1B is also triggered for a period of e.g. 500 ns. An output 4 of timer IC1A and an output 12 of timer IC1B are coupled to each other via diodes D2 and D3. These diodes D2 and D3 form an AND-gate so that the output signals of the timers IC1A and IC1B are combined in the interference presence signal 27 such that the interference presence signal 27 has a low voltage during the times that the timers IC1A and/or IC1B are triggered.

The interference removal means 28 comprise an analog switch IC2 (such as included in the Philips' 74HCT4053 integrated circuit) for muting the signal 11, which was first fed into a low-pass anti-aliasing filter 62 and a delay circuit 24. Normally the signal 11, which is supplied to the analog switch IC2 at input Z, is passed by the analog switch IC2 via output Z1 to the circuit output 30. When the interference presence signal 27 has a low voltage (i.e. during the times that the timers IC1A and/or IC1B are triggered by the interference detector 66) the signal 11 is passed to output Z0. This effectively mutes the signal at the circuit output 30.

The interference absorption circuit 20 comprises a desensitizer 67 for temporarily disabling the interference detection means 26 when a repetition rate of the interference components is too high. The desensitizer 67 may comprise a multiple triggerable pulse timer IC6A (such as included in the Philips' 74HCT123 integrated circuit). The interference presence signal 27 is supplied to an input A of this timer IC6A. When the interference presence signal 27 has a low voltage the timer IC6A is triggered and the signal at output Q\ of the timer IC6A has a low voltage for a period of time that is defined by the combination of capacitor C23, resistor R4 and variable resistor ADJ5. The output Q\ of the timer IC6A is coupled via an RC-low-pass filter (formed by resistor R11 and capacitor C17) to the timers IC1A and IC1B. The signal at output Q\ is smoothed by the RC-filter so that it decreases when the repetition rate of interference presence signal 27 increases. After some threshold (adjusted by ADJ5) is exceeded the timers IC1A and IC1B of the interference detection means 26 are disabled and stop triggering. This ensures that the interference absorption circuit 20 will not hang after an excessive noise attack. Alternatively, the desensitizer 67 may (also) disable the interference removal means in order to ensure the correct operation of the interference absorption circuit 20 under such extreme conditions.

FIGS. 6A to 6E show some waveforms which illustrate the operation of the interference absorption circuit as shown in FIG. 5. FIG. 6A illustrates the operation of the interference detector 66. The positive threshold of the voltage comparator A and the negative threshold of the voltage comparator B are respectively indicated as the horizontal lines at y=+0.4 and y=−0.4. The voltage comparator A detects interference components included in the signal 11 which exceed the positive voltage threshold. When such an interference component is detected by the voltage comparator A, timer IC1A is triggered for a period of e.g. 500 ns. FIG. 6A shows that the voltage comparator A detects an interference component at t≈920 ns. As a consequence, timer IC1A is triggered and the signal at output 4 of timer IC1A has a low voltage for 500 ns (see FIG. 6B which shows the signal at output 4 of timer IC1A). The voltage comparator B detects interference components included in the signal 11 which exceed the negative voltage threshold. When such an interference component is detected by the voltage comparator B, timer IC1B is triggered for a period of e.g. 500 ns. FIG. 6A shows that the voltage comparator B detects an interference component at t≈1120 ns. As a consequence, timer IC1B is triggered and the signal at output 12 of timer IC1B has a low voltage for 500 ns (see FIG. 6C which shows the signal at output 12 of timer IC1B).

The output signals of the timers IC1A and IC1B as shown in FIGS. 6B and 6C, respectively, are combined by an AND-gate (diodes D2 and D3) in the interference presence signal 27 (see FIG. 6D). FIG. 6E shows signal 11', which is the signal 11 as filtered and delayed by the anti-aliasing filter 62 and the delay line 24, and the interference presence signal 27. Due to the operation of the analog switch IC2 the signal 11' is muted from t≈920 ns until t≈1620 ns.

FIG. 7 shows an electrical diagram of another embodiment of an interference absorption circuit 20 according to the invention which can advantageously be used for detecting and removing impulsive noise interference in AM-radio receivers. This embodiment makes uses of the fact that the impulsive noise response at low RF-levels consists of a series of pulses (see FIG. 8A). The steepness of the slopes can be seen as a measure for the audibility of the pulses (i.e. the higher the slewrate, the more audible it is). The interference detector 66 is a slope or slewrate detector which triggers on the slope of the first pulse and on the slope of each following pulse as long as they have enough energy (see the trigger pulses in FIG. 8B). The timing means 68 comprise a multiple triggerable pulse timer which is triggered a number of times by the interference detector 66. Each time that the multiple triggerable pulse timer is triggered it is triggered for a certain period of time, e.g. 240 $\mu$s. This results in an interference presence signal 27 (see FIG. 8C for a possible implementation where the interference presence signal 27 has a high value when interference components are detected and a low value when not; alternatively, in the embodiment of FIG. 7 the interference presence signal 27 has a low value when interference components are detected and a high value when not) which controls the interference removal means 28 (which is a muting circuit) in dependence on the duration of the individual interference components.

The slewrate detector detects interference components in the signal 11 which exceed a certain slewrate threshold. This slewrate detector has an adjustable slewrate (adjustable by means of the 15 k and the 47 k (adjustable) resistors which define the maximum output current of an Operational Transconductance Amplifier OTA1. This output current divided by the value of the capacitor at the output of the OTA1 defines the maximum slewrate of the slewrate detector). If the slewrate of the input signal (in this embodiment this is the signal 11 as obtained after demodulation) at the input of the slewrate detector is larger than the slewrate of the slewrate detector, the output of the operational amplifier OPAMP1, which normally is at a constant potential, is temporarily at a relatively large (positive or negative) potential. This pulse is rectified by a rectifier such as included in the integrated circuit AD736, in order to enable the detection on positive as well as on negative pulses, and supplied to the timing means 68.

If the slewrate of the signal 11 is smaller than the slewrate of the slewrate detector, the combination of the OPAMP1 and the OTA1 forms a linear low-pass filter. A cut-off frequency of this low-pass filter, which is defined by the gain of the OPAMP1 and its surrounding components, is preferably set at a relatively high frequency (e.g. above the audio frequency range) in order to obtain a relatively fast operation of the slewrate detector.

In the timing means 68 the voltage of the pulses supplied by the interference detector 66 are compared in a voltage comparator COMP2 with a reference voltage. During the time that the voltage of a pulse is larger than the reference voltage, the transistor, such as the BC548c, is switched open so that the 5n6 capacitor is charged via this transistor. As a consequence, the voltage over the 5n6 capacitor increases. This voltage is compared in a voltage comparator COMP1 with a reference voltage Vref. If the voltage over the 5n6 capacitor is larger than the reference voltage Vref, the output voltage of the voltage comparator (i.e. the interference presence signal 27), which normally has a relatively high value, attains a relatively low voltage.

The 5n6 capacitor and the 62 k resistor define a RC-time of 240 $\mu$S. When the transistor is opened the 5n6 capacitor is charged and the voltage at the negative input of the voltage comparator COMP1 increases. When the transistor is closed the 5n6 capacitor is discharged and the voltage at the negative input of the voltage comparator COMP1 decreases. As a consequence, when this voltage becomes smaller than the reference voltage Vref, the interference presence signal attains its normal relatively small value.

The interference removal means 28 in this embodiment is a muting circuit and it comprises an Operational Transconductance Amplifier OTA2 which is controlled by the interference presence signal 27. If the interference presence signal has a relatively high value (normal case, no pulse detected) the signal 11 is passed from the circuit input 22 via a 330 n capacitor, an operational amplifier OPAMP2, the OTA2 and a 100 n capacitor to the circuit output 30. If the interference presence signal has a relatively low value (pulse detected) the OTA2 blocks or mutes signal 11.

The scope of the invention is not limited to the embodiments shown. The invention is embodied in each new characteristic and each combination of characteristics. Any reference signs do not limit the scope of the claims. The word "comprising" does not exclude the presence of elements or steps other than those listed in a claim. Use of the word "a" or "an" preceding an element does not exclude the presence of a plurality of such elements.

What is claimed is:

1. A transmission system for transmitting a signal from a transmitter to a receiver, the receiver comprising:
   an interference absorption circuit including interference detection means for detecting interference components included in the signal and interference removal means for substantially removing, during a time interval, the interference components from the signal;
   wherein the interference absorption circuit is arranged for adapting the time interval in dependence on the duration of the individual interference components and comprises a desensitizer for temporarily disabling at least one of the interference detection means and the interference removal means when a repetition rate of the interference components is too high.

2. A transmission system according to claim 1, wherein the time interval is substantially equal to the duration of the individual interference components.

3. A transmission system according to claim 1, wherein the interference absorption circuit comprises a circuit input for receiving the signal, the interference detection means being coupled to the circuit input for detecting the interference components included in the signal, and the interference removal means being coupled to the circuit input for substantially removing the interference components from the signal, an output of the interference detection means being coupled to an input of the interference removal means.

4. A transmission system according to claim 3, wherein the interference detection means are arranged for generating and supplying to the output an interference presence signal indicative of the presence of the interference components in the signal, the interference removal means being arranged for substantially removing the interference components from the signal in dependence on the interference presence signal received at the input.

5. A transmission system according to claim 4, wherein the interference detection means are arranged for generating the interference presence signal in dependence on the duration of the individual interference components.

6. A transmission system according to claim 4, wherein the interference detection means comprise timing means for generating the interference presence signal.

7. A transmission system according to claim 6, wherein the interference detection means further comprise an interference detector coupled to the timing means for detecting the interference components in the signal, the timing means comprising a multiple triggerable pulse timer, the interference detector being arranged for generating and supplying to the timing means a number of trigger pulses, the number of trigger pulses being dependent on the duration of the interference components.

8. A transmission system according to claim 3, wherein the interference absorption circuit further comprises delay means for delaying the signal, the interference removal means being coupled to the circuit input via the delay means, the delay introduced by the delay means being substantially equal to the delay introduced by the interference detection means.

9. A receiver for receiving a signal from a transmitter the receiver comprising:
   an interference absorption circuit for detecting interference components included in the signal and for substantially removing, during a time interval, the interference components from the signal;
   wherein the interference absorption circuit is arranged for adapting the time interval in dependence on the duration of the individual interference components and comprises a desensitizer for temporarily disabling the detecting or removing of interference components when repetition rate of the interference components is too high.

10. An interference absorption circuit for detecting interference components included in a signal and for substantially removing, during a time interval, the interference components from the signal wherein the interference absorption circuit is arranged for adapting the time interval in dependence on the duration of the individual interference components and for disabling the detecting or removing of interference components when a repetition rate of the interference components is too high.

11. A method, comprising the steps of:
    detecting interference component included in a signal;
    substantially removing, during a time interval, the interference components from the signal; and
    temporarily disabling at least one of an interference detection module and an interference removal module when a repetition rate of the interference components is too high;
    wherein the time interval is adapted in dependence on the duration of the individual interference components.

12. The method of claim 11, wherein the time interval is substantially equal to the duration of the individual interference components.

13. The method of claim 11, further comprising generating an interference presence signal indicative of the presence of the interference components in the signal; and
    wherein substantially removing the interference components comprises substantially removing the interference components from the signal in dependence on the interference presence signal.

14. The method of claim 13, wherein generating the interference presence signal comprises generating the interference presence signal in dependence on the duration of the individual interference components.

15. The method of claim 11, wherein the detecting the interference components comprises:
    generating a number of trigger pulses, the number of trigger pulses being dependent on the duration of the interference components;
    triggering a multiple triggerable pulse timer using the number of trigger pulses; and
    generating an interference presence signal at the multiple triggerable pulse timer, the interference presence signal comprising information related to the duration of the individual interference components.

16. The method of claim 11, further comprising delaying the signal by a delay; and wherein the delay introduced into the signal is substantially equal to a delay introduced during the step of substantially removing the interference components from the signal.

17. The receiver of claim 9, wherein the interference absorption circuit comprises:
    a circuit input for receiving the signal;
    an interference detention module coupled to the circuit input for detecting the interference components included in the signal; and
    an interference removal module coupled to the circuit input for substantially removing the interference components from the signal, an output of the interference detection module being coupled to an input of the interference removal module.

18. The receiver of claim 17, wherein:
    the interference detection module is arranged for generating and supplying to the output an interference presence signal indicative of the presence of the interference components in the signal; and
    the interference removal module is arranged for substantially removing the interference components from the signal in dependence on the interference presence signal received at the input.

* * * * *